United States Patent [19]

Oyama et al.

[11] Patent Number: 4,822,560

[45] Date of Patent: Apr. 18, 1989

[54] COPPER ALLOY AND METHOD OF MANUFACTURING THE SAME

[75] Inventors: Yoshimasa Oyama; Masato Asai; Toru Tanigawa; Shigeo Shinozaki, all of Nikko; Shoji Shiga, Utsunomiya, all of Japan

[73] Assignee: The Furukawa Electric Co., Ltd., Tokyo, Japan

[21] Appl. No.: 916,694

[22] Filed: Oct. 8, 1986

[30] Foreign Application Priority Data

| Oct. 10, 1985 | [JP] | Japan | 60-225559 |
| Oct. 10, 1985 | [JP] | Japan | 60-225561 |
| Oct. 10, 1985 | [JP] | Japan | 60-225560 |
| Nov. 29, 1985 | [JP] | Japan | 60-268753 |
| Apr. 10, 1986 | [JP] | Japan | 61-82746 |
| Apr. 10, 1986 | [JP] | Japan | 61-82747 |
| Apr. 10, 1986 | [JP] | Japan | 61-82745 |
| Jun. 17, 1986 | [JP] | Japan | 61-141076 |

[51] Int. Cl.$^4$ .................................. C22C 9/02
[52] U.S. Cl. ..................... 420/470; 420/473; 420/476; 148/433
[58] Field of Search ............... 420/470, 473, 476, 482, 420/484, 493, 494, 495, 903; 148/412, 413, 433, 434, 11.5 C

[56]  References Cited

U.S. PATENT DOCUMENTS

| 4,430,298 | 2/1984 | Miyafuji et al. | 148/11.5 C |
| 4,439,247 | 3/1984 | Arita et al. | 148/11.5 C |
| 4,605,532 | 8/1986 | Knorr et al. | 148/11.5 C |

FOREIGN PATENT DOCUMENTS

| 52-123923 | 10/1977 | Japan . | |
| 53-47286 | 12/1978 | Japan . | |
| 108235 | 7/1982 | Japan | 420/484 |
| 145745 | 8/1984 | Japan | 420/470 |
| 61-9385 | 3/1986 | Japan . | |

*Primary Examiner*—L. Dewayne Ruthedge
*Assistant Examiner*—George Wyszomierski
*Attorney, Agent, or Firm*—Oblon, Fisher, Spivak, McClelland & Maier

[57] ABSTRACT

A copper alloy is disclosed which comprises 0.01 to 1.0 wt. % of Cr, 0.01 to 8 wt. % of Sn, 0.001 to 5 wt. % of at least one of 0.001 to 5 wt. % of Zn, 0.001 to 0.5 wt. % of Mn and 0.001 to 0.2 wt. % of Mg and the remainder of Cu, the content of $O_2$ therein being not more than 0.005 wt. %. A method of manufacturing therefor is described wherein, after the hot processing or the heat treatment at 800° to 950° C., the alloy is cooled by passage through a region of 800° to 400° C. within 20 minutes, then following cold processing, heating treatment is carried out for at least 1 minute at 400° to 650° C. The alloy with the composition aforementioned is used as an alloy material for electric or electronic instruments.

26 Claims, No Drawings

COPPER ALLOY AND METHOD OF MANUFACTURING THE SAME

BACKGROUND OF THE INVENTION

The present invention relates to a copper alloy with an improved composition and method of manufacturing the same. In particular, the invention relates to a copper alloy for electronic instruments suitable above all for the lead of electronic parts such as semiconductors etc. and which is excellent in strength, thermal and electric conductance, platability, solderability, bonding ability, corrosion resistance, heat resistance and processibility and the manufacturing method therefor. Namely, the alloy of the invention is an engineering material for the precision lead frame.

Various copper alloys have been utilized for the parts of electronic instruments, for example, the lead frame material of semiconductors (transistor, IC, LSI, VLSI, diode, etc.), heat sink material, the lead material of electronic parts, spring material of structural parts (connector, switch, relay, etc.) and different kinds of terminal materials. Recently, accompanying the miniaturization, high performance and high densification of the parts of electronic instruments, an alloy with higher performance has become necessary. Particularly, in the case the semiconductor, the high integration is startling, and, for the lead frame thereof, high strength and excellent radiation property (electric and thermal conductance) are needed. For this reason, in place of Fe 42-Ni or Fe 29-Ni 17-Co, a copper alloy excellent in electric and thermal conductance is desired.

The phosphor bronze (Cu-Sn type), which is a typical copper alloy excellent in strength as high as 50 to 70 kg/mm$^2$ and used widely for the connector, relay, switch and terminal, is not necessarily suitable for the lead frame since the electroconductivity is as low as 10 to 20% IACS. Moreover, it is susceptible to stress corrosion cracking and, more important, with lapse of time the bonding strength by soldering deteriorates, and the alloy shows a tendency to cause peeling off of Sn or Sn-Pb plating. For this reason, Cu-Fe type alloys having characteristics of 50 to 65% IACS of electroconductivity, 45 to 55 kg/mm$^2$ of tensile strength and 2.5 to 10% of elongation, for example, C 194 (CU-2.4 wt.% Fe-0.12 wt.% Zn-P alloy) (hereinafter, wt.% is abbreviated as % simply) and C 195 (Cu-1.5% Fe-0.8% Co-0.6% Sn-P alloy) have come to be used. However, these alloys come to have a microstructure dispersed with a lot of Fe or compounds among Fe, Co and P. As a result, the microcracks are apt to occur at the time of precise bending molding of the lead portion during miniaturation, the bonding strength by soldering is poor, and the adhesion of Ag plating etc. is insufficient. Furthermore, there are Cu-Ni-Si type alloys having similar characteristics to the alloys described above, but these alloys also have the same problems.

With the alloys as described above, the deficiencies in the electric and thermal conductance and the moldability come into question in rapid miniaturization and high integration of the semiconductor and, at the same time, particularly since the surfacemount technology has gained power as a mount system of high density, the strength at the bonding portion by soldering shows a tendency to be deteriorated with the lapse of time, which is worrisome.

For the electronic instruments represented by the semiconductor, the following characteristics are needed:

(1) To be excellent in strength and electric and thermal conductance, in particular, to have more than 30% IACS of electroconductivity and more than 50 kg/mm$^2$ of tensile strength in the use as a lead frame. More preferably, to have more than 70% IACS. Also, more than 60 kg/mm$^2$ is needed for the lead frame of high density because of the narrow width of lead. These needs are intense also in uses other than the lead frame.

(2) To be able to keep the bonding strength by soldering as well as the solderability and the wettability with solder for a long period of time.

(3) To be excellent in platability.

(4) To have heat resistance, that is, to be able to keep the above mentioned strength even at 300° to 400° C.

(5) To have corrosion resistance, that is, to to be resistant to stress corrosion cracking and oxidation at high temperature.

(6) To be suitable for wire bonding.

(7) To be able to be manufactured economically.

As a result of extensive investigations in view of the above situation, a copper alloy for electronic instruments suitable above all for the lead of electronic parts such as semiconductors etc. and excellent in strength, radiation property, formability, platability, bonding strength by soldering, corrosion resistance, heat resistance, etc. and a method of manufacturing the same have been developed by the inventions.

SUMMARY OF THE INVENTION

The copper alloy according to the invention contains 0.01 to 1.0%, preferably, in particular, 0.05 to 0.5% or 0.15 to 0.4% of Cr, 0.01 to 8%, preferably, in particular, 0.05 to 6% or 0.05 to 0.5% of Sn and 0.001 to 5% of at least one kind of 0.001 to 5% of Zn, 0.001 to 0.5% of Mn and 0.001 to 0.2% of Mg, preferably, in particular, 0.01 to 1% of at least one kind of 0.01 to 1% of Zn, 0.01 to 0.2% of Mn and 0.005 to 0.1% of Mg, the content of $O_2$ therein being not more than 0.005%, preferably, in particular, not more than 0.0025%.

In the alloy aforementioned, it is useful to make P≦0.02%, preferably, in particular, 0.0001%≦P≦0.01%. Moreover, it is also advantageous for the purpose of the invention to make S≦0.001%.

In the invention, at least one element selected from the group below can be contained in amounts of not more than 0.5%.

| | |
|---|---|
| Ag ≦ 0.2% | Pb ≦ 0.05% |
| Be ≦ 0.1% | Ti ≦ 0.1% |
| Ca ≦ 0.1% | Zr ≦ 0.2% |
| Cd ≦ 0.2% | V ≦ 0.05% |
| B ≦ 0.1% | Nb ≦ 0.05% |
| Al ≦ 0.2% | Ta ≦ 0.1% |
| Y ≦ 0.1% | Sb ≦ 0.5% |
| RE ≦ 0.1% | As ≦ 0.1% |
| In ≦ 0.1% | Te ≦ 0.1% |
| Tl ≦ 0.1% | Fe ≦ 0.2% |
| Si ≦ 0.2% | Co ≦ 0.5% |
| Ge ≦ 0.1% | Ni ≦ 0.5% |

It is preferable, in particular, to contain 0.05 to 0.5% of Ni.

The alloy of the invention as above has a homogeneous and minute microstructure and the inclusions or precipitations larger than 3μ are less than 10$^3$/mm$^2$.

The alloy with the composition aforementioned can be finished into a desired shape through hot and cold processing or directly through cold processing after melting and casting. In the latter, a thin and long ingot obtained from the strip casting is submitted to cold rolling. Of course, during the cold processing, a heat treatment is carried out once or more than once depending on the necessity. In the former, a large-sized cake or billet obtained from the watercooled casting is processed preliminarily through the hot processings such as hot rolling, hot forging, hot extrusion, etc. and thereafter it enters the cold processing step.

In the manufacturing process as above, the conditions suitable for the alloy of the invention are as follows; at least a part of hot processing or heat treatment (hereinafter, referred to as hot process) is carried out at 800° to 950° C., cooling is conducted at a rate passing through a region of 800° to 400° C. within 20 minutes and then, following the cold processing, heating is carried out for at least 1 minute at 400° to 650° C. As the particularly advantageous conditions, after the hot process at 850° to 950° C., cooling is made by allowing to pass through a region of 800° to 400° C. within 20 minutes, the cold processing more than 30% in amounts is carried out and then the heat treatment is made for more than 5 minutes at 400° to 550° C. This cold processing and heat treatment are conducted at least once.

After the heat treatment described above, the cold processing is carried out to finish to a desired size and mechanical performance. Furthermore, in order to release the excess mechanical strain, such processes as low-temperature annealing, tension leveling, leveling, tension annealing, etc. can be added.

Besides, in the hot processing above, the preheating and the soaking or homogenization treatment prior to the processing are also included.

DETAILED DESCRIPTION OF THE INVENTION

Sn, which is the first ingredient, forms a solid solution with Cu atomically thereby strengthening the solid solution. Since the formability and the moldability are ample and precipitations are not a characteristic of the alloy forming the solid solution, the bonding property, platability, etching property, solderability, etc. are excellent. The solid solution-forming action above can be exerted advantageously in practice at 0.01 to 8%, particularly, 0.05 to 6% of Sn. However, since the electroconductivity is lowered at a composition of high Sn, a composition of low Sn becomes a necessary condition in uses where electronduductivity and the radiation property are required. When the electroconductivity is higher than 20% IACS, the content of Sn is not more than about 4% and, when the former is higher than 60% IACS, the latter is not more than about 0.5%.

Cr, which is the second ingredient, is a deposition type ingredient, the solubility of which is extremely low at ordinary temperature. Therefore, it acts copperatively with Sn to improve the strength of the Cu-Sn type alloy drastically. Consequently, since the strength can be made high by suppressing the content of Sn, it is suitable for electronic instruments, in particular, the lead frame for a semiconductor. The action of Cr described above can be exerted practically at 0.01 to 1% of Cr. However, since precipitation becomes significant at a composition of high Cr, remarkable strengthening effects cannot be obtained, but rather the formability, platability, bonding property, solderability, etc. are diminished. These, 0.05 to 0.5%, particularly, 0.15 to 0.4% of Cr is advantageous above all in the use for precision electronic instruments. As a more important action of Cr, susceptibility to stress corrosion cracking of Cu-Sn type alloy can be decreased remarkably so as vertually not to show susceptibility to cracking at all.

Zn, Mn and Mg, which are the third ingredients, readily exert high cooperative effects with Sn and Cr aforementioned and are essential ingredients to improve the characteristics at the same time. Namely, they can promote the effective precipitation of Cr in the minutely dispersed state and inhibit the harmful action of $O_2$ described later. For this reason, the practical characteristics such as formability platability, solderability, etching property, bonding property, etc. can be developed advantageously. Further, they are indispensable ingredients to improve the confidence of the bonding portion by soldering which is carried out universally with the electronic instruments. Because of the formation of a porous brittle layer in a part of Cu-Sn reaction layer resulting from the solid phase reaction between Sn in the solder and Cu in Cu-Sn-Cr alloys with the lapse of time, the bonding strength deteriorates with time. This has been experienced also with conventional alloys such as phosphor bronze, Cu-Fe, etc. as described above and, for this reason, it has been necessary to carry out extra plating with Cu, Ni, etc. Since the third ingredients prevent this, they are suitable particularly for the lead of surface-mount devices. Although a similar phenomenon occurs also in the case of plating with Sn or Sn-Pb used widely for the electronic instruments causing peeling off, the third ingredients are effective for this.

Further, they improve the adhering strength of oxidized scale by decreasing the oxidation at high-temperature. This fact is extremely important in practice since a plurality of heating processes at high temperature are involved in the manufacture of semiconductors etc.

The actions aforementioned are exerted practically at 0.001 to 5% of Zn, 0.001 to 0.5% of Mn and 0.001 to 0.2% of Mg. Excessive Zn and Mn lower the electroconductivity, while excessive Mg makes the manufacture of the alloy difficult due to the affinity thereof with $O_2$. Preferably, in particular, the contents of Zn, Mn and Mg are 0.01 to 1%, 0.01 to 0.2% and 0.005 to 0.1%, respectively.

In the alloy of the invention described above, the content of $O_2$ should be confined to be not more than 0.005%, preferably, in particular, not more than 0.0025%. Not only does excessive $O_2$ combine with the ingredients such as Cr, Sn, Mg, Cu, etc. to obstruct the action of these additives, but also the existence of oxides deteriorates remarkably the practical characteristics such as platability, solderability, bonding property, etc., which are necessary in uses such as electronic instruments, together with the hindrance of formability. The reduction in the amount of $O_2$ can be accomplished through adsorption with charcoal etc. or the utilization of a nonoxidative atmosphere in the melting and casting process, but the incorporation of inevitable $O_2$ is prevented through the action of the third ingredients aforementioned.

The limits of P and S to $P \leq 0.02\%$ and $S \leq 0.001\%$ can also bring about important effects for the improvement in the practical characteristics. These impurities damage the homogeneity of microstructure through the formation of coarse crystallizates due to the combination of Cr with a part of a fourth ingredient described later. If this occurs, the etching and the plating treatment cannot be conducted uniformly, particularly in the cases of minute precision circuits and parts. For example, the wire bonding in the manufacture of semiconductors is made by ultrasonic bonding using wires of Au, Cu, Pd and Al with a width of 15 to 50μ, but bonding is obstructed by the existence of crystallizates. Since a trace of P shows beneficial actions such as the improvement in the melt flow property at the time of casting etc., an amount of 0.0001 to 0.001% is preferable particularly. The third ingredients Mg and Mn exert also an effect to prevent the harmful action of S.

The fourth ingredients are twenty-four elements aforementioned. Ag, which is an ingredient for the formation of solid solution, does not lower the electroconductivity and exerts similar actions to Sn, Zn and Mn. It acts also to enhance corrosion resistance. Be makes the crystals minute and strong and can inhibit the high-temperature oxidation. Ca acts to remove S and $O_2$ similarly to Mg etc. Cd acts to make the strength, heat resistance, solderability, etc. better without lowering electroconductivity, though it is a toxic element. B acts as a deoxidant. Al acts as a deoxidant and, at the same time, it prevents high-temperature oxidation, but it is harmful for the electroconductivity if present in excess. Y, RE (rare earth), In and Tl act to remove $O_2$ and S similarly. They exert an effect for making the tissue minute substances and are effective for improvement in the heat resistance, oxidation resistance and strength.

Si is beneficial for the castability and the oxidation resistance. Ti and Zr act to enhance heat resistance and exert the actions to remove $O_2$ and S. In particular, Zr is the most effective to improve the heat resistance without lowering electroconductivity, resulting in an improvement in strength. Ge is an effective element to suppress the deposition of Cr. Pb contributes greatly to the machinability and the pressing property at high speed as well as desulfurization and an improvement in heat resistance. V, Nb and Ta make the grains minute and remove S and homogenize and strengthen of the microstructure. Sb acts to make the reliability of bonding with solder and plating with Sn better. As and Te make the grains minute and raise the heat resistance and are effective for improving the high speed pressing property and machinability. Fe, Co and Ni are ingredients working to make the grains minute and to strengthen them. These are particularly effective ingredients when coexisting with trace of P. Moreover, the fact that Fe, V, Nb, Ta, Ti, Zr, Co and Ni together with Cr contribute to the improvement in the hot processing, which is one of the difficulties in the manufacture of high-Sn alloy, it is important not to neglect these ingredients in practice. The foregoing fourth elements incur such disadvantages as lowering the electroconductivity, raising cost, excessive deposition, decrease in the formability, etc., if present in excess, so that they are confined to the concentration ranges described above.

The practical characteristics and the quality of the alloy of the invention as above are obstructed frequently by coarse precipitations. This was noted previously with regard to an example of the lead frame for a semiconductor. As the precipitations in the invention, there are Cr and phosphorized and sulfurized substances of Cr, a part of the fourth ingredients and the compounds thereof and various oxides. In particular, the coarse substances with particle sizes more than 5μ are harmful and the amount thereof is preferably in a density of less than $10^3/mm^2$. These substances are measured under the optical or electron microscope after polishing the section and slight etching according to ordinary methods.

The manufacturing method capable of developing the characteristics of the alloy of the invention described above sufficiently was described in detail in the preceding paragraph. Moreover, from the detailed explanation about the actions of foregoing ingredients, the basis of the engineering conditions for the manufacture is considered to be obvious. When the hot process is carried out at 800° to 950° C., in particular, 850° to 950° C., a substantial portion of the Cr ingredient can be made to form a solid solution. Not only the first ingredient, the third ingredients and a part of the fourth ingredients aforementioned (Ag, Ge, Al, etc.) act to prevent the precipitations from becoming coarse by suppressing the formation of inhomogeneous nuclei and the precipitations of Cr, but also they allow the solid solution to be maintained at an ordinary temperature substantially by passing through the process at a temperature down to 400° C. within 20 minutes. For this reason, the alloy can be manufactured economically without necessity of special installations and processes such as quenching in water etc. Moreover, by submitting it to the heat treatment for more than 1 minute at 400° to 650° C., preferably, in particular, for more than 5 minutes at 400° to 550° C. after the cold processing, particularly, after giving the processing strain more than 30%, the effect with time can be exerted advantageously. Though the excessive heating allows the precipitations to become coarse, there is no problem in practice even for about several hours because of the relatively low temperatures used.

EXAMPLE 1

Using a graphite crucible, the alloys formulated as shown in Table 1 were melted and converted to the ingots with a width of 100 mm, a thickness of 40 mm and a length of 300 mm by water-cooled casting with a metal mold. After the outer portion was planed these were submitted to hot rolling to a thickness of 5 mm by heating from 920° to 820° C. and then cooled with air. The time required for the rolling was 5 minutes. The temperature at the time of hot rolling was 600° to 720° C. and the average cooling time down to 400° C. was 5 to 10 minutes. The details of the conditions during hot rolling are shown in Table 2. After the outer portion was planed again to a thickness of 4.5 mm, the alloys were made to a thickness of 0.4 mm by means of cold rolling and thereafter they were submitted to heat treatment for 2 hours at 430° C. Following this, cold rolling was carried out to a thickness of 0.25 mm and finally a low-temperature annealing was conducted for 0.5 hours at 300° C.

Of these alloys, the tensile strength, elongation, electroconductivity, bending property, bonding strength by soldering, platability, stress corrosion cracking and thickness of oxidized scale were measured, and the results are shown in Table 3 in comparison with those of conventional alloys C 195 (Cu-1.5% Fe-0.8% Cu-0.6% Sn-0.1% P alloy) and phosphor bronze (Cu-5.9% Sn-0.1% P alloy).

For the measurement of the bending property, the occurrence of microcracks was examined after being bent with 90° dies different in the tip radius (R) and the result was expressed by a ratio to the thickness of plate (t) R/t. The measurement was made with regard to both directions perpendicular (GW) and parallel (BW) to the direction of rolling. For the bonding strength by soldering, after a lead wire for pulling was soldered eutectically on the portion with a diameter of 12 mm, this was kept for 300 hours at 150° C. and the tensile test was conducted to obtain the strength. For the platability, the surface was etched to a depth of about 0.3$\mu$ by pickling with $H_2SO_4$—$H_2O_2$ after being degreased by electrolysis. Then, following neutralization with 5% KCN solution, Ag plating with a thickness of 5$\mu$ was carried out in the Ag plating baths below. Thereafter, heating was carried out for 5 minutes on a hot plate of 475° C. to observe the existence of the occurrence of blisters under a stereoscope. For the stress corrosion cracking (SCC), the tensile test at a constant load of 35 kg/mm$^2$ was conducted in 3% ammonia vapor according to JIS C8306 to determine the time until the occurrence of cracking.

Ag strike plating bath

| AgCN | 3 g/l |
| KCN | 30 g/l |
| Bath temperature | 25° C. |
| Current density | 5 A/dm$^2$ |
| Time | 10 sec |

Ag strike plating bath

| AgCN | 30 g/l |
| KCN | 40 g/l |
| $K_2CO_3$ | 20 g/l |
| Bath temperature | 25° C. |
| Current density | 1.5 A/dm$^2$ |

TABLE 1

| No. | Sn | Cr | Third ingredient | Fourth ingredient | $O_2$ | S | P |
|---|---|---|---|---|---|---|---|
| 1 | 0.21 | 0.55 | Zn 0.75 | — | 0.0020 | 0.0008 | 0.0005 |
| 2 | 0.17 | 0.40 | Zn 0.005<br>Mn 0.08 | — | 0.0015 | 0.0005 | 0.0019 |
| 3 | 0.05 | 0.67 | Mg 0.05<br>Mn 0.05 | — | 0.0010 | 0.0005 | 0.0044 |
| 4 | 0.15 | 0.29 | Zn 0.51<br>Mg 0.002 | Ag 0.1 | 0.0016 | 0.0004 | 0.0019 |
| 5 | 0.46 | 0.25 | Zn 0.004<br>Mg 0.002 | Sb 0.15<br>Zr 0.05 | 0.0010 | 0.0006 | 0.0025 |
| 6 | 0.48 | 0.31 | Mn 0.002<br>Mg 0.005<br>Zn 0.25 | In 0.1 | 0.0020 | 0.0007 | 0.0007 |
| 7 | 0.42 | 0.71 | Zn 0.25 | Fe 0.09<br>Ca 0.005 | 0.0036 | 0.0006 | 0.0055 |
| 8 | 1.9 | 0.09 | Zn 0.09 | Co 0.08<br>B 0.009 | 0.0016 | 0.0009 | 0.0038 |
| 9 | 2.2 | 0.24 | Mn 0.08<br>Mg 0.005 | — | 0.0010 | 0.0005 | 0.0005 |
| 10 | 3.1 | 0.28 | Mn 0.001<br>Zn 0.13 | Al 0.1<br>Cd 0.09 | 0.0020 | 0.0002 | 0.0019 |
| 11 | 5.9 | 0.19 | Zn 0.10 | — | 0.0010 | 0.0009 | 0.0090 |
| 12 | 6.1 | 0.05 | Zn 0.10 | Zr 0.09<br>Co 0.15<br>Nb 0.05 | 0.0015 | 0.0005 | 0.0080 |
| Comparative example | | | | | | | |
| 101 | 0.05 | 1.5 | Zn 0.51 | — | 0.0022 | 0.0005 | 0.0015 |
| 102 | 0.09 | 0.35 | — | — | 0.0020 | 0.0007 | 0.0069 |
| 103 | 0.21 | 0.55 | Zn 7.5 | — | 0.0015 | 0.0004 | 0.0045 |
| 104 | 0.25 | 0.36 | Zn 0.05<br>Mn 0.8 | — | 0.0016 | 0.0005 | 0.0010 |
| 105 | 0.49 | 0.15 | Zn 0.15<br>Mg 0.5 | — | 0.0005 | 0.0003 | 0.0029 |
| 106 | 0.48 | 0.19 | Mn 0.1 | Ti 0.5 | 0.0015 | 0.0004 | 0.0011 |
| 107 | 0.44 | 0.28 | Mn 0.1<br>Mg 0.005 | Fe 0.45 | 0.0011 | 0.0005 | 0.0024 |
| 108 | 0.40 | 0.28 | Zn 0.25 | MM 0.05 | 0.0075 | 0.0004 | 0.0002 |

TABLE 2

| No. | Start temperature for hot rolling (°C.) | Final temperature for the same (°C.) | Cooling time down to 400° C. (min) |
|---|---|---|---|
| 1 | 910 | 720 | 10 |
| 2 | 900 | 700 | 9 |
| 3 | 920 | 720 | 10 |
| 4 | 880 | 700 | 8 |
| 5 | 870 | 670 | 7 |
| 6 | 880 | 670 | 7 |
| 7 | 870 | 660 | 6 |
| 8 | 870 | 670 | 7 |
| 9 | 860 | 650 | 7 |
| 10 | 850 | 630 | 6 |
| 11 | 820 | 610 | 5 |
| 12 | 830 | 600 | 5 |
| 101 | 910 | 700 | 9 |
| 102 | 920 | 730 | 10 |
| 103 | 900 | 700 | 8 |
| 104 | 880 | 690 | 7 |

TABLE 2-continued

| No. | Start temperature for hot rolling (°C.) | Final temperature for the same (°C.) | Cooling time down to 400° C. (min) |
|---|---|---|---|
| 105 | 860 | — | — |
| 106 | 870 | — | — |
| 107 | 860 | 650 | 6 |
| 108 | 880 | 660 | 6 |

TABLE 3

| No. | Tensile Strength (kg/mm$^2$) | Elongation (%) | Electro-conductivity (% IACS) | Bending property (R/t) (GW) | (BW) | Bonding strength by soldering (kg/mm$^2$) | Ag platability (Existence of blister) | Time until SCC (hr) |
|---|---|---|---|---|---|---|---|---|
| 1 | 60 | 7.7 | 73 | 0.6 | 1.0 | 1.1 | No | >300 |
| 2 | 58 | 7.8 | 74 | 0.6 | 1.0 | 1.0 | " | " |
| 3 | 55 | 6.9 | 83 | 0.8 | 1.2 | 1.0 | " | " |
| 4 | 59 | 8.0 | 75 | 0.6 | 0.8 | 1.2 | " | " |
| 5 | 64 | 8.8 | 59 | 0.6 | 0.8 | 0.90 | " | " |
| 6 | 62 | 8.5 | 60 | 0.6 | 0.6 | 0.85 | " | " |
| 7 | 65 | 7.0 | 57 | 0.8 | 1.2 | 0.79 | " | " |
| 8 | 55 | 9.1 | 32 | 0.4 | 0.6 | 0.75 | " | " |
| 9 | 57 | 9.5 | 34 | 0.4 | 0.6 | 0.88 | " | " |
| 10 | 67 | 9.5 | 29 | 0.4 | 0.4 | 0.90 | " | " |
| 11 | 73 | 9.5 | 18 | 0.2 | 0.4 | 0.98 | " | " |
| 12 | 74 | 9.0 | 16 | 0.4 | 0.4 | 0.88 | " | " |
| 101 | 56 | 5.1 | 85 | 1.2 | 2.4 | 0.9 | Yes | >300 |
| 102 | 55 | 6.9 | 86 | 0.8 | 1.0 | 0.3 | No | " |
| 103 | 62 | 7.7 | 49 | 0.6 | 0.8 | 1.1 | " | 120 |
| 104 | 59 | 7.8 | 56 | 0.6 | 0.8 | 1.0 | " | >300 |
| 105 | — | — | — | — | — | — | — | — |
| 106 | — | — | — | — | — | — | — | — |
| 107 | 63 | 6.0 | 42 | 1.2 | 2.0 | 0.50 | Yes | >300 |
| 108 | 59 | 5.1 | 62 | 1.4 | 2.6 | 0.31 | " | " |
| Phosphor bronze | 69 | 9.8 | 15 | 0.2 | 0.4 | 0.20 | No | 160 |
| C195 | 54 | 7.1 | 53 | 1.4 | 2.0 | 0.29 | Yes | >300 |

As is evident from Table 1, Table 2 and Table 3, it can be seen that the alloys of the invention No. 1 through 12 are all superior in all characteristics to the conventional alloys phosphor bronze and C195. Namely, phosphor bronze is excellent in the formability, but is poor in the bonding strength by soldering and stress corrosion cracking together with the electroconductivity, and C195 is poor in the formability, platability and bonding strength by soldering and the electroconductivity is also not so high. This fact would become more obvious if the results of No. 11 and 12 which have the same degree of Sn as phosphor bronze are seen. Although, with a part of the alloys of high Sn, some fell short of 20% in the electroconductivity, many have high electroconductivity and high strength of more than 30% IACS and more than 55 kg/mm$^2$, respectively.

Among the alloys of comparative examples, No. 105 and 106 being in excess of Mg and Ti were discontinued because of too much cracking at the time of hot processing. No. 101 and 108 having an excess of Cr and O$_2$ also caused cracking partially resulting in the low yield. No. 101 having an excess of Cr was poor in formability and caused blisters on heating due to the poor adhesion of Ag plating.

No. 102 not containing the third ingredients showed not only severe deterioration of the strength with solder, but also a tendency toward somewhat inferior formability, too. On the other hand, in the cases of No. 103 and 104 which have an excess of Zn and Mn, substantial improvement in the strength could not be realized despite significant lowering in the electroconductivity and SCC was caused partially. No. 107 which has excess of Fe, which belongs to the fourth ingredients, was poor in the platability and solderability and showed also low electroconductivity. No. 108 having an excess of O$_2$ was poor in the formability, platability and solderability.

EXAMPLE 2

The ingots (40×40×300 mm) with compositions shown in Table 4 were obtained similarly to the foregoing examples. After heating for 15 minutes at 875° C., they were submitted to hot rolling to make the thickness 10 mm. The time required for the processing was about 30 minutes and the final temperature was 670° to 700° C. These were cooled with water and the temperature became lower than 100° C. within 5 minutes. Following the pickling, these articles were submitted to rolling to a thickness of 1.2 mm and then heated for 25 minutes at 450° C. Thereafter, rolling was carried out to 0.40 mm and the heating was carried out again for 30 minutes at 420° C. After the repeated rolling to 0.20 mm, they were passed through a tension leveler with a strain ratio of 0.2% and finally a heat treatment was carried out for 15 minutes at 300° C.

Of the articles thus obtained, measurements similar to Example 1 were carried out. However, the bending was tested merely in the BW direction. Moreover, Ag plating was made 3µ and, after the heat treatment for 5 minutes at 425° C. in the atmosphere, the conditions of which corresponded to those of die bonding in the process of manufacturing the semiconductor, an Au wire with a width of 23µ was bonded at 280° C. by means of automatic thermosonic bonding. A test was made with a pull tester using 1000 pieces of loops with a length of 2 mm formed through ball bond and stitch bond. Judging one broken at a portion of wire not the bonding portion as normal and one peeled off at the bonding portion as poor, the yield was calculated. The peeling off was caused only on the side of stitch bond. The bonding conditions were 50 g of load, 0.05 W of ultrasonic power and 50 msec of ultrasonic time.

Moreover, as one of the tests for the platability, Sn-5Pb alloy plating was made to a thickness of 7.5µ using a fluoroborate bath and then this was kept for 2000 hours at 105° C. Thereafter, by observing the peeling off of the plating layer at a portion bent by 180° C. under the microscope (magnification: 10), the adhesion was examined. For the measurement of the density of precipitations, after etching the surface of rolling softly with NH$_4$OH—H$_2$O$_2$ liquor, precipitations larger than 5μ were counted by observation under scanning electron microscope. The measurement was made at four positions on both top and bottom faces and the values were averaged. Results obtained in the measurements described above are collected in Table 5.

In this table, the results of C194 (Cu-2.3 Fe-0.15 Zn-0.04P), which is utilized widely together with C195 aforementioned as a conventional alloy, were also put down for comparison. This alloy is inferior not only in the strength and electroconductivity but also in the solderability, platability and bonding property. It is presumed that this is due to the inferiority in the Ag platability observed with C195 in preceding example, though the size of most of the precipitations such as Fe etc. was less than 3μ.

TABLE 4

| No. | Sn | Cr | Third ingredient | Fourth ingredient | O$_2$ | S | P |
| --- | --- | --- | --- | --- | --- | --- | --- |
| 21 | 0.10 | 0.28 | Mg 0.008<br>Mn 0.08 | — | 0.0011 | 0.0005 | 0.0050 |
| 22 | 0.08 | 0.29 | Mg 0.006<br>Mn 0.08 | Si 0.05 | 0.0016 | 0.0004 | 0.0020 |
| 23 | 0.40 | 0.34 | Zn 0.1 | Ca 0.009 | 0.0008 | 0.0004 | 0.0050 |
| 24 | 0.41 | 0.32 | Zn 0.5<br>Mg 0.031 | — | 0.0008 | 0.0006 | 0.0032 |
| 25 | 0.42 | 0.30 | Mn 0.1 | MM 0.08 | 0.0015 | 0.0005 | 0.0011 |
| 26 | 2.1 | 0.02 | Mg 0.004<br>Zn 0.09 | Ni 0.19 | 0.0020 | 0.0005 | 0.012 |
| 27 | 2.0 | 0.15 | Mn 0.1<br>Zn 0.01 | Be 0.05 | 0.0015 | 0.0003 | 0.0021 |
| 28 | 2.2 | 0.28 | Zn 0.15 | Pb 0.005<br>Y 0.09 | 0.0011 | 0.0005 | 0.0015 |
| 29 | 2.0 | 0.25 | Zn 0.19 | Te 0.005<br>V 0.006<br>Fe 0.04 | 0.0015 | 0.0003 | 0.0069 |
| Comparative example | | | | | | | |
| 111 | 0.40 | 0.28 | Mg 0.009<br>Mn 0.04 | — | 0.0010 | 0.0006 | 0.035 |
| 112 | 0.44 | 0.31 | Zn 0.1 | — | 0.0024 | 0.0020 | 0.0050 |
| 113 | 0.41 | 0.22 | Zn, Mg, Mn 0.0005 | — | 0.0016 | 0.0002 | 0.0065 |
| 114 | 0.44 | 0.003 | Mn 0.2 | Ni 1.1 | 0.0009 | 0.0002 | 0.0055 |

TABLE 5

| No. | Tensile strength (kg/mm$^2$) | Elongation (%) | Electro-conductivity (% IACS) | R/t (BW) | Time until SCC (hr) | Bonding strength by soldering (kg/mm$^2$) | Peeling off of Sn—Pb plating | Bonding yield (%) | Crystallizates (1/mm$^2$) |
| --- | --- | --- | --- | --- | --- | --- | --- | --- | --- |
| 21 | 59 | 9.0 | 82 | 0.5 | >500 | 0.90 | No | 98.1 | 330 |
| 22 | 61 | 7.9 | 80 | 0.5 | " | 0.92 | " | 99.0 | 140 |
| 23 | 62 | 10.0 | 70 | 0.3 | " | 0.75 | " | 98.0 | 400 |
| 24 | 62 | 9.5 | 72 | 0.5 | " | 0.92 | " | 98.5 | 250 |
| 25 | 63 | 10.1 | 69 | 0.4 | " | 0.91 | " | 99.5 | 20 |
| 26 | 58 | 9.9 | 30 | 0.3 | " | 0.80 | " | 96.7 | 530 |
| 27 | 57 | 10.0 | 34 | 0.3 | " | 0.88 | " | 99.6 | 30 |
| 28 | 67 | 7.9 | 33 | 0.4 | " | 0.81 | " | 99.5 | 90 |
| 29 | 66 | 7.0 | 35 | 0.4 | " | 0.80 | " | 99.1 | 90 |
| 111 | 60 | 8.5 | 71 | 0.6 | >500 | 0.70 | No | 89.1 | 3100 |
| 112 | 61 | 8.0 | 71 | 0.6 | " | 0.85 | " | 89.6 | 2500 |
| 113 | 62 | 9.6 | 73 | 0.5 | " | 0.21 | Yes | 96.1 | 890 |
| 114 | 57 | 7.9 | 67 | 0.8 | 120 | 0.60 | No | 99.0 | 30 |
| 115 | 49 | 9.0 | 78 | 0.6 | >500 | 0.91 | " | 91.0 | 4000 |
| 116 | 44 | 8.0 | 88 | 0.7 | " | 0.90 | " | 92.2 | 4400 |
| C194 | 50 | 7.0 | 61 | 1.6 | " | 0.41 | Yes | 86.5 | 1500 |

Comparative example No. 111 is an example with P exceeding 0.02% and the fact that this contains coarse precipitations of Cr-P compound is a particular to the bonding. This is the same also in the case of No. 112 with S exceeding 0.001%. No. 113 in which the third ingredients were deficient had a low bonding strength by soldering, the Su-Pb plating peeled off and the precipitations (Cr mainly) also showed a tendency toward becoming coarse. No. 114 in which Cr was deficient exhibited stress corrosion cracking and showed a tendency toward the deterioration of bonding strength by soldering as well as being poor in the strength, electroconductivity and formability even if Ni were added in excess.

Next, for comparison, after heating for 30 minutes at 750° C., No. 23 was treated similarly thereafter (No. 115). As a result, Cr precipitated coarsely, the strength fell short of 50 Kg/mm² and the bonding yield was low. Moreover, after the hot processing, No. 21 alloy was cooled to 400° C. over 45 minutes in the furnace and then treated similarly (No. 116). It gave similar results to those of No. 115.

EXAMPLE 3

In order to examine the adhesion of oxidized scale, after pickling for cleaning, No. 1, No. 4, No. 102, No. 24, No. 25 and No. 113 were heated for various periods of time on a hot plate of 300° to 400° C. to produce the oxidized scales with different thicknesses. After the incisions were made in a lattice shape with a cutter knife, a tape peeling test was conducted using polyester adhesive tape (made by 3M Co.). In this test, the thickness of scale at a limit where the scales having been peeled off were transferred to the side of the tape was determined. The thickness of scale was determined by the cathode reduction method. The results are shown in Table 6.

TABLE 6

| No. 1 | 3200Å |
|---|---|
| 4 | 3500 |
| 24 | 3050 |
| 25 | 2900 |
| 102 | 2200 |
| 113 | 2050 |

The results in Table 6 show that, in the cases of the alloys of the invention in which the third ingredients are contained, even the oxidized scale being thicker by about 1000 Å is enhanced in adhesion. Since the die bonding and the wire bonding are carried out most frequently in the atmosphere at 250° to 450° C. in the process of manufacturing the semiconductor, it is known widely that the occurrence of brittle scale here becomes a serious obstruction for the subsequent processes such as sealing of a resin mold etc.

As described, in accordance with the invention, the practical characteristics of high performance required for the copper alloy for electronic instruments represented by the lead frame of semiconductors are satisfied, and, when used for the heat sink, members for heat-exchange, spring materials, members of a terminal, electroconductive materials, etc. as well as the lead frame and lead wire of electronic parts such as a semiconductor etc., remarkable effects can be obtained in the enhancement of the desirable properties thereof.

What is claimed is:

1. An alloy consisting essentially of 0.09 to 0.4 wt.% of Cr, 0.01 to 8 wt.% of Sn, 0.001 to 5 wt.% in total of at least one of 0.001 to 5 wt.% of Zn, 0.001 to 0.5 wt.% of Mn and 0.001 to 0.2 wt.% of Mg and the balance being Cu, and wherein the content of $O_2$ in said alloy is not more than 0.005 wt.%.

2. The alloy according to claim 1, wherein the content of Cr is 0.15 to 0.4 wt.%.

3. A lead for a semiconductor having the composition according to claim 2.

4. The alloy according to claim 2, wherein the content of Sn is 0.05 to 4 wt.%.

5. A lead for a semiconductor having the composition according to claim 4.

6. The alloy according to claim 1, wherein the content of P is not more than 0.02 wt.%.

7. The alloy according to claim 6, wherein the content of P is 0.0001 to 0.001 wt.%.

8. A lead for a semiconductor having the composition according to claim 7.

9. A lead for a semiconductor having the composition according to claim 6.

10. The alloy according to claim 1, wherein the content of of $O_2$ is not more than 0.0025 wt.%.

11. A lead for a semiconductor having the composition according to claim 10.

12. The alloy according to claim 1, wherein the content of S is not more than 0.001 wt.%.

13. A lead for a semiconductor having the composition according to claim 12.

14. The alloy according to claim 1, wherein the content of Sn is 0.05 to 0.5 wt.%.

15. A lead for a semiconductor having the composition according to claim 14.

16. The alloy according to claim 1, wherein said alloy contains precipitates or inclusions not smaller than 5 microns, and having not more than $10^3/mm^2$ thereof.

17. A lead for a semiconductor having the composition according to claim 16.

18. The alloy according to claim 1, consisting essentially of 0.09 to 0.4 wt.% of Cr, 0.05 to 6 wt.% of Sn and 0.005 to 1 wt.% in total of at least one of 0.01 to 1 wt.% of Zn, 0.01 to 0.2 wt.% of Mn and 0.005 to 0.1 wt.% of Mg, and wherein the content of P is 0.0001 to 0.005 wt.%, the content of $O_2$ is not more than 0.0025 wt.% and the content of S is not more than 0.001 wt.%.

19. The alloy according to claim 18, wherein the content of Sn is 0.05 to 3 wt.%.

20. A lead for a semiconductor having the composition according to claim 19.

21. The alloy according to claim 18, wherein the content of Sn is 0.05 to 0.5 wt.%.

22. A lead for a semiconductor having the composition according to claim 21.

23. The alloy according to claim 18, wherein the content of Ni is 0.05 to 0.5 wt.%.

24. A lead for a semiconductor having the composition according to claim 23.

25. An alloy material for electric or electronic instruments having the composition according to claim 18.

26. A lead for a semiconductor having the composition according to claim 18.

* * * * *